United States Patent
Doko et al.

[11] Patent Number: 5,837,388
[45] Date of Patent: Nov. 17, 1998

[54] ALUMINUM ALLOY SOLDER MATERIAL, ITS MANUFACTURING METHOD, BRAZING SHEET USING THIS MATERIAL, AND METHOD OF MANUFACTURING ALUMINUM ALLOY HEAT EXCHANGER USING THIS SHEET

[75] Inventors: Takeyoshi Doko; Koji Okada, both of Tokyo, Japan

[73] Assignee: The Furukawa Electric Co., Ltd., Japan

[21] Appl. No.: 692,441

[22] Filed: Aug. 5, 1996

[30] Foreign Application Priority Data

| Aug. 7, 1995 | [JP] | Japan | 7-201177 |
| Jan. 18, 1996 | [JP] | Japan | 8-006240 |
| Apr. 18, 1996 | [JP] | Japan | 8-096937 |

[51] Int. Cl.⁶ .......................... C22C 21/12; C22C 21/02; B32B 15/10
[52] U.S. Cl. .......................... 428/654; 428/650; 148/438; 420/529; 420/530; 420/531; 420/537; 420/538; 420/540; 420/548; 420/550; 420/553
[58] Field of Search .......................... 428/650, 654; 420/529, 531, 537, 538, 548, 530, 540, 550, 553; 165/133; 148/438

[56] References Cited

U.S. PATENT DOCUMENTS

| 4,749,627 | 6/1988 | Ishikawa et al. | 428/654 |
| 5,460,895 | 10/1995 | Rungta et al. | 428/654 |
| 5,476,725 | 12/1995 | Papich et al. | 428/654 |
| 5,481,084 | 1/1996 | Patrick et al. | 219/123 |

FOREIGN PATENT DOCUMENTS

| 92322 | 12/1977 | Japan . |
| 8-103883 | 4/1996 | Japan . |

*Primary Examiner*—Leszek Kiliman
*Assistant Examiner*—Holly C. Rickman
*Attorney, Agent, or Firm*—Lorusso & Loud

[57] ABSTRACT

The present invention relates to an Al alloy solder material comprising a composition containing Si in an amount of more than 7.0 to 12.0% or less by weight, Cu in an amount of more than 0.4 to 8.0% or less by weight, Zn in an amount of more than 0.5 to 6.0% or less by weight, Mn in an amount of more than 0.05 to 1.2% or less by weight and Fe in an amount of more than 0.05 to 0.5% or less by weight, or at need, further one or both of In and Sn respectively in an amount of 0.3% or less by weight, with the remainder being Al and inevitable impurities. A brazing sheet clad with the solder material and used for various members of the heat exchanger enables satisfactory brazing at a temperature as low as 570° to 580° C. and is excellent in corrosion resistance. Since the brazing sheet is brazed at a low temperature, a high-strength material having a low melting point is used for a core material of a fin, a tube or the like. Thus, the reduction of a sheet thickness and that of size and weight of the Al alloy heat exchanger are realized. Since this solder material contains Mn and Cu or the like, this solder material has an advantage in being manufactured, namely recycled from scrapped Al alloy heat exchangers or scraps of brazing sheets when manufactured in a factory.

7 Claims, 4 Drawing Sheets

ALUMINUM ALLOY SOLDER MATERIAL, ITS MANUFACTURING METHOD, BRAZING SHEET USING THIS MATERIAL, AND METHOD OF MANUFACTURING ALUMINUM ALLOY HEAT EXCHANGER USING THIS SHEET

BACKGROUND OF THE INVENTION

1. Field of the Invention:

This invention relates to an Al alloy solder material, its manufacturing method, a brazing sheet using this material and a method of manufacturing an Al alloy heat exchanger using this sheet. More particularly, the present invention relates to an Al alloy solder material which enables brazing at low temperatures so that a high strength member having a low melting point is used as a core material of a brazing sheet, and other thin members (for instance, fins of a heat exchanger) are rarely buckled during brazing to realize the reduction of size and weight of an Al alloy heat exchanger, and which is excellent in recycling properties so that scrapped Al alloy heat exchangers in general are particularly reused as the raw material of a solder material for a brazing sheet when renewedly manufactured.

2. Description of the Prior Art:

A description will now be given of an Al alloy heat exchanger by taking the case of a radiator. As shown in FIG. 1, the radiator has a plurality of flat tubes 1 and corrugated thin fins 2 integrally formed between the flat tubes 1, and both ends of the flat tube 1 are respectively opened to a space defined by a header 3 and a tank 4, whereby a high-temperature fluid such as water is sent from a space on one tank side to a space on the other tank side through the flat tubes 1 to lower the temperature of the fluid through a heat exchange performed at portions of the tubes 1 and the fins 2, and the resultant low-temperature fluid is then circulated again.

A brazing sheet 6 is used as a tube material and a header material of a heat exchanger like the radiator 10. As shown in FIG. 3, the brazing sheet 6 has a core material 61 made of, for instance, JIS3003 alloy (i.e., Al-Mn-Cu alloy with the content of Mn in an amount of 1.2% by weight and Cu in an amount of 0.1% by weight), the inner side of the core material, i.e., the side normally in contact with a fluid (water) is clad with JIS7072 alloy (i.e., Al-Zn alloy with the content of Zn in an amount of 1.0% by weight) as a sacrifice material 63, and the outer side of the core material is clad with a solder material 62 usually made of JIS4045 alloy (i.e., Al-Si alloy with the content of Si in an amount of 10% by weight). The brazing sheet 6 is formed into predetermined members such as a tube and a header which are then assembled into one body together with corrugated fins or other members by means of brazing.

FIG. 8 shows a serpentine-type condenser 30, which makes use of a flat porous tube 31 tabularly extruded by means of hot working, as shown in FIG. 9. In the serpentine-type condenser 30, this tube 31 is bent into a serpentine shape, and corrugated fins 32 made of brazing sheets are attached between the mutually adjacent tubes 31. Reference numeral 33 in FIG. 8 denotes a connector. The flat porous tube 31 is made of JIS3003 alloy or the like. Further, a brazing sheet 32 normally used for the corrugated fin 32 has, as shown in FIG. 10, a core material 321 made of JIS3003 alloy or an alloy additionally containing Zn or the like on purpose to give a sacrifice effect to the JIS3003 alloy, and both surfaces of the core material are clad with solder materials 322, 322' made of JIS4045 or 4343 alloy (i.e., Al-Si alloy with the content of Si in an amount of 8% by weight).

FIG. 4 shows a laminated-type evaporator (by the name of a drawn cup evaporator) 20 as one of Al alloy heat exchangers having a hollow structure using a brazing sheet. As shown in FIGS. 5 to 7, the evaporator 20 has a member 21 (See FIGS. 5 and 6) which defines a fluid (freon) passage 22 and is manufactured by press-forming a brazing sheet (See FIG. 7) consisting of a core material 24 having both surfaces clad with solder materials 25, 25'. In the evaporator 20, the fluid passage member 21 is laminated as shown in FIG. 4, corrugated fins 23 are attached between the laminated fluid passage members 21, and side plates 26, 26', a fluid inlet pipe 27 and a fluid outlet pipe 28 are further arranged and assembled into a core, which is then integrally brazed.

In general, freon (refrigerant) is used as the fluid in case of the evaporator just as the above embodiment, while water is used as the fluid in case of the radiator.

Conventionally, a bare fin material having a thickness of about 0.08 mm is used for the fin 23, and a brazing sheet having a thickness of about 0.6 mm is used for the fluid passage member 21.

The fins 23 and the fluid passage members 21 are assembled according to a brazing method including a step of heating up to a temperature close to 600° C. for brazing. As the brazing method, use is made of a flux brazing method, a vacuum brazing method, a non-corrosion brazing method using a non-corrosive flux and so on.

Incidentally, the brazing sheet defined in this specification means a sheet adapted for brazing and includes a sheet consisting of a core material having one or both surfaces clad with an Al-Si solder material. Further, this brazing sheet is manufactured as follows. Namely, a core material and a solder material serving as a skin material are individually melted and cast into alloys having predetermined alloy compositions to prepare slabs or plates, which are then brought into contact with each other through hot-cladding, and the resultant sheet is further cold-rolled (and annealed at need) into a sheet having a predetermined thickness.

Recently, a heat exchanger has a tendency to reduce its size and weight, and there have been demands that members constituting the heat exchanger should be thinned. However, in case of thinning these members according to a conventional method, various problems are encountered as follows.

When a tube or the like serving as a fluid passage constituent member or a fin is thinned, its strength becomes insufficient in some cases. Thus, some high-strength alloys have been proposed as an alloy for the thin tube or fin. However, in the existing circumstances, the strength of the thin tube or fin is still insufficient by reason of the conditions of a brazing process or the proportion to other characteristics such as corrosion resistance. Specifically, the addition of alloying elements is required for the improvement of strength. On the other hand, the addition of alloying elements causes a drop in melting point, and melting sometimes occurs in a process of heating up to a temperature close to 600° C. for brazing.

Further, when an alloy containing Cu is used for a core material of a brazing sheet having a sacrifice material and adapted for a fluid passage constituent member (tube), Cu is diffused in a sacrifice layer in brazing. As a result, the sacrifice layer becomes lost its own effect to degrade corrosion resistance. For that reason, the amount of Cu added to the core material for the improvement of strength is limited.

Further, when the fin is thinned and as a result, its strength becomes insufficient, the fin is easily buckled in brazing. When the fin is buckled, a ventilation resistance is increased to lower the heat exchange effectiveness of the heat exchanger. In addition, when the fin is thinned, solder is undesirably diffused to the fin and melted in heating for brazing in some cases.

Further, in order to overcome the problem in that the heat exchange effectiveness of the heat exchanger is lowered in consequence of the reduction of the thickness of a material, a fin having excellent thermal conductivity has been developed. For instance, a fin material made of an Al-Zr alloy has been proposed. However, such a fin material has disadvantages in that its strength is insufficient, and solder is easily diffused in heating for brazing.

In addition to the above problems, recently, there have been demands that raw materials should be recycled from the viewpoint of the effective utilization of global resources. An automobile heat exchanger is removed in dismantling, and then melted into an Al alloy.

However, as described above, the Al alloy heat exchanger manufactured according to the brazing method has a different alloy composition on a member basis. For instance, the tube material, the header material, the fin material and the core material, the solder material and the sacrifice material of the brazing sheet or the like are different from one another in alloy composition. The average alloy composition of the Al alloy heat exchanger when melted as a whole contains large amounts of Mn, Si and Zn or the like, and therefore, results in an incomplete composition which is not suitable for recycling to other materials. Thus, an Al alloy slab resulting from melting the Al alloy heat exchanger manufactured according to the brazing method cannot be used except for the purpose of casting. Considering the future increase of scrapped vehicles in quantity or the switchover from a copper heat exchanger to the Al alloy heat exchanger and so on, it is highly necessary that a large quantity of scrapped Al alloy heat exchangers composed of the above-mentioned constituent members should be recycled for the solder material of the brazing sheet for a renewedly-manufactured heat exchanger as they are, instead of the material for casting.

Further, a large quantity of scraps (i.e., scraps resulting from trimming both ends of a sheet) produced in case of manufacturing the Al alloy brazing sheet for the heat exchanger in a factory cause problems in that the average alloy composition of the scraps when melted results in an alloy composition unsuitable for recycling, and therefore, such the scraps cannot be developed as the raw material for the solder material serving as the skin material of the brazing sheet.

For reference, Table 1 shows the average alloy composition of the scrapped Al alloy heat exchanger in a prior art when melted, and that of the scraps of the brazing sheet in a prior art when manufactured in the factory. As is apparent from Table 1, a considerable amount of Si (in the range of 1.8 to 2.5% by weight), that of Fe (in the range of 0.2 to 0.3% by weight), that of Cu (in the range of 0.1 to 0.5% by weight), that of Mn (1.0% by weight) and that of Zn (in the range of 0.3 to 1.2% by weight) are contained.

It is an object of the present invention to overcome the above problems.

Namely, one object of the present invention is to provide an Al alloy solder material, which enables brazing at low temperatures (570° to 585° C.) so that a high-strength member having a low melting point is used for a core material of a brazing sheet adapted for heat exchanger members such as a tube serving as a fluid passage member and a header, and the reduction of size and weight of the Al alloy heat exchanger is realized by lessening the buckling of other thin members (i.e., fins of the heat exchanger) during the brazing, and also to provide a brazing sheet using such an Al alloy solder material.

Another object of the present invention is to provide an Al alloy solder material which is excellent in recycling properties so that scrapped Al alloy heat exchangers manufactured mainly using a brazing sheet material is reused as the raw material for a solder material of a brazing sheet when renewedly manufactured, and also to provide a method of manufacturing such an Al alloy solder material.

SUMMARY OF THE INVENTION

The present invention for attaining the above objects has the following features.

Namely, as the first aspect of the present invention, there is provided an Al alloy solder material, which comprises a composition containing Si in an amount of more than 7.0 to 12.0% or less by weight, Cu in an amount of more than 0.4 to 8.0% or less by weight, Zn in an amount of more than 0.5 to 6.0% or less by weight, Mn in an amount of 0.05 to 1.2% or less by weight, and Fe in an amount of 0.05 to 0.5% or less by weight, or at need, one or both of In and Sn respectively in an amount of 0.3% or less by weight, with the remainder being Al and inevitable impurities.

As the second aspect of the present invention, there is provided a method of manufacturing an Al alloy solder material, which comprises the step of manufacturing the Al alloy solder material as described above using scrapped Al alloy heat exchangers or scraps of Al alloy brazing sheets when manufactured in a factory.

As the third aspect of the present invention, there is provided a brazing sheet, which is used for a fin of a heat exchanger, and comprises a core material made of an Al-Si-Fe or Al-Si-Fe-Cu-Mn alloy, wherein both surfaces of the core material are clad with an Al alloy solder material having a composition containing Si in an amount of more than 7.0 to 12.0% or less by weight, Cu in an amount of more than 0.4 to 8.0% or less by weight, Zn in an amount of more than 0.5 to 6.0% or less by weight, Mn in an amount of more than 0.05 to 1.2% or less by weight and Fe in an amount of more than 0.05 to 0.5% or less by weight, or at need, one or both of In and Sn respectively in an amount of 0.3% or less by weight, with the remainder being Al and inevitable impurities.

As the fourth aspect of the present invention, there is provided a brazing sheet, which is used for a fluid passage constituent member of a heat exchanger and comprises a core material made of an Al-Si-Fe-Cu-Mn alloy, wherein one surface of the core material constituting the outside of a fluid passage of the heat exchanger is clad with an Al alloy solder material having a composition containing Si in an amount of more than 7.0 to 12.0% or less by weight, Cu in an amount of more than 0.4 to 8.0% or less by weight, Zn in an amount of more than 0.5 to 6.0% or less by weight, Mn in an amount of more than 0.05 to 1.2% or less by weight and Fe in an amount of more than 0.05 to 0.5% or less by weight, or at need, one or both of In and Sn respectively in an amount of 0.3% or less by weight, with the remainder being Al and inevitable impurities, and the other surface of the core material constituting the inside of the fluid passage is clad with an Al alloy sacrifice material.

As the fifth aspect of the present invention, there is provided a brazing sheet, which is used for a fluid passage constituent member of a heat exchanger and comprises a core material made of an Al-Si-Fe-Cu-Mn alloy, wherein one surface of the core material constituting the outside of a fluid passage of the heat exchanger is clad with an Al alloy solder material having a composition containing Si in an amount of more than 7.0 to 12.0% or less by weight, Cu in an amount of more than 0.4 to 8.0% or less by weight, Zn in an amount of more than 0.5 to 6.0% or less by weight, Mn in an amount of more than 0.05 to 1.2% or less by weight and Fe in an amount of more than 0.05 to 0.5% or less by weight, or at need, one or both of In and Sn respectively in an amount of 0.3% or less by weight, with the remainder being Al and inevitable impurities.

As the sixth aspect of the present invention, there is provided a brazing sheet, which is used for a fluid passage constituent member of a heat exchanger and comprises a core material made of an Al-Si-Fe-Cu-Mn alloy, wherein both surfaces (i.e., surfaces constituting the outside and inside of a fluid passage of the heat exchanger) are clad with an Al alloy solder material having a composition containing Si in an amount of more than 7.0 to 12.0% or less by weight, Cu in an amount of more than 0.4 to 8.0% or less by weight, Zn in an amount of more than 0.5 to 6.0% or less by weight, Mn in an amount of more than 0.05 to 1.2% or less by weight and Fe in an amount of more than 0.05 to 0.5% or less by weight, or at need, one or both of In and Sn respectively in an amount of 0.3% or less by weight, with the remainder being Al and inevitable impurities.

As the seventh aspect of the present invention, there is provided a method of manufacturing an Al alloy heat exchanger, which comprises the steps of forming the brazing sheet as defined in the third to sixth aspects of the present invention into a predetermined member of the heat exchanger, and then assembling these members into the heat exchanger by means of brazing at temperatures in the range from 570° to 585° C.

Hereinafter, a detailed description will be given of the first to seventh aspects of the present invention in due order.

(1) Concerning the first and second aspects of the present invention:

The first and second aspects of the present invention relate to an Al alloy solder material and its manufacturing method.

Specifically, the first aspect of the present invention relates to an Al alloy solder material which comprises a composition containing Si in an amount of more than 7.0 to 12.0% or less by weight, Cu in an amount of more than 0.4 to 8.0% or less by weight, Zn in an amount of more than 0.5 to 6.0% or less by weight, Mn in an amount of more than 0.05 to 1.2% or less by weight and Fe in an amount of more than 0.05 to 0.5% or less by weight, or at need, one or both of In and Sn respectively in an amount of 0.3% or less by weight, with the remainder being Al and inevitable impurities.

The most remarkable characteristics of the solder material according to the present invention are that the solder material enables brazing at temperatures as low as 570° to 585° C., and is effective in corrosion resistance, strength and others which will be described later when the solder material is used as a brazing sheet in combination with a preferable core material, and that scrapped Al alloy heat exchangers and scraps of the brazing sheets when manufactured in a factory are capable of being recycled for the solder material of the brazing sheet since the solder material contains large amounts of Mn, Cu and Zn or the like.

Incidentally, the present inventors have previously proposed a solder material (Al-Si-Cu-Zn-Fe alloy) adapted for brazing at a temperature lower than a normal brazing temperature (about 600° C.) (See Japanese Patent Laid-open No. 7-24593 and others). This previously-proposed solder material is greatly different from the solder material (Al-Si-Cu-Zn-Fe-Mn alloy) used in the present invention in that the solder material used in the present invention contains Mn in the alloy for the improvement in corrosion resistance of the solder material itself, and is provided in consideration for recycling properties so that the scraps as described above are reused as the raw material for the solder material of the brazing sheet when renewedly manufactured.

Firstly, a description will be given of the meaning of each alloying elements added to the solder material of the present invention and the reason why the range of its composition is limited.

The addition of Si is effective in lowering the melting point of an alloy. However, when Si is added in an amount of 7.0% or less by weight, the melting point is not sufficiently lowered, and as a result, brazing at a temperature of 585° C. or less cannot be performed. On the other hand, when Si is added in an amount of more than 12.0% by weight, the melting point is reversely raised, and as a result, brazing at a temperature of 585° C. or less cannot be performed. In addition, the formability is degraded to make it hard to manufacture the brazing sheet. Accordingly, the amount of Si added is set to be in the range from more than 7.0 to 12.0% or less by weight.

The addition of Cu is effective in lowering the melting point of an alloy and improves the fluidity of solder. Further, when an alloy containing Cu is used for the core material of a fluid passage constituent member made of the brazing sheet, Cu functions to heighten the corrosion resistance on the outside of the fluid passage constituent member of the heat exchanger. The present inventors have made various examinations of the corrosion resistance on the outside of the fluid passage constituent member of the heat exchanger, and as a result, it is found that when Cu is not added to the solder material, Cu contained in the core material of the fluid passage constituent member is diffused in the solder material during the brazing to produce a low Cu region in the vicinity of a boundary between the solder material and the core material, and the low Cu region is preferentially corroded to cause an intensive corrosion accompanied by a blister. On the other hand, according to the present invention, since Cu is added to the solder material, Cu contained in the core material is prevented from being diffused in the solder material so as to produce no low Cu region in the vicinity of the boundary between the solder material and the core material, and as a result, the improved corrosion resistance is attained. In this case, when Cu is added in an amount of 0.4% or less by weight, the effect on improvement in corrosion resistance is not satisfactorily produced. On the other hand, when Cu is added in an amount of more than 8.0% by weight, the rolling workability of the solder alloy is degraded to make it hard to perform pressure welding required for the brazing sheet for the member of the heat exchanger when manufactured according to a normal method. Accordingly, the amount of Cu added is set to be in the range from more than 0.4 to 8.0% or less by weight.

The addition of Zn is effective in lowering the melting point of an alloy. When the solder material of the present invention is applied to the brazing sheet, although the occurrence of blister due to the outside corrosion is restrained in case of using a solder alloy containing Cu according to the present invention, the potential of solder becomes nobler than the potential of the core material, and the outside corrosion is advanced at high speed in the shape of pits. On the other hand, the addition of Zn is effective in lowering the potential of the solder down close to the potential of the core material alloy to improve the corrosion resistance of the core material. However, when Zn is added in an amount of 0.5% or less by weight, the above effect is not satisfactorily produced. On the other hand, when Zn is added in an amount of more than 6.0% by weight, not only the self corrosion resistance of the solder but also the rolling workability of the solder alloy material is degraded, and therefore, the resultant solder material in this case is not suitable as a solder material adapted for the brazing sheet for the member of the heat exchanger. Accordingly, the amount of Zn added is set to be in the range from more than 0.5 to 6.0% or less by weight.

The addition of Mn is effective in improving the corrosion resistance by adapting a compound containing Mn for an intermetallic compound produced from the solder when solidified after having been melted. In case of an alloy containing no Mn, an Al-Fe-Si intermetallic compound containing Fe is produced in solidification, and corrosion is started from this intermetallic compound portion. On the other hand, according to the present invention, since Mn is contained in the solder material, the characteristics of the intermetallic compound are varied to extremely improve the corrosion resistance. Specifically, the life of the alloy up to its corrosion in case of containing Mn is extended twice or more as long as that of the alloy up to its corrosion in case of containing no Mn. The content of Mn in an amount of more than 0.05% by weight is required for exerting such effects. When Mn is added in an amount of more than 1.2% by weight, a coarse compound containing Mn is formed to degrade the formability required for an alloy, and as a result, the working of the alloy subsequent to casting is made impossible. Accordingly, the amount of Mn added is set to be in the range from more than 0.05 to 1.2% or less by weight.

The addition of Fe is effective in making grains of the solder finer when the solder is solidified after having been melted, and also in heightening the strength of a fillet. Fe is preferably added in an amount of more than 0.05% by weight. When Fe is added in an amount of 0.05% or less by weight, the above effects are not satisfactorily produced. As described above, Fe functions to form the intermetallic compound in solidification, and the corrosion is started from this intermetallic compound portion. On the other hand, when the amount of Fe added is increased, some of Fe do not function to form a compound in combination with Mn. Accordingly, the upper limit of the amount of Fe added is preferably set to be 0.5% by weight from the viewpoint of balance between the effect of making the grains finer and the corrosion.

In and Sn are not necessary for the solder alloy material of the present invention. However, In and Sn are effective in making the potential of the solder less-noble to improve the corrosion resistance of the core material of the fluid passage constituent member. Thus, In and Sn function to promote the effects of Zn. The amounts of In and Sn added are respectively set to be 0.3% or less by weight, and their lower limits are preferably set to be 0.002% or more by weight.

Although the inevitable impurities may be contained in the solder material if the content of each element other than the above is 0.30% or less by weight, the content of inevitable impurities is preferably set to be 0.05% or less by weight.

As is apparent from the examples which will be described later, the solder material of the present invention comprises the above alloy composition and is excellent in characteristics required for a solder material.

Although the Al alloy solder material of the present invention is preferably used as the solder material of the brazing sheet adapted for the member of the heat exchanger, it may be used for various wire materials as a single solder material, for instance, preplaced solder.

Further, in addition to the above case, the Al alloy solder material of the present invention is usable as a solder material for an Al alloy extruded clad tube and that for thermal spraying to an Al alloy tube or the like.

Specifically, the second aspect of the present invention relates to a method of manufacturing the Al alloy solder material of the present invention from scrapped Al alloy heat exchangers or scraps of Al alloy brazing sheets when manufactured in the factory.

As described above, recently, the recycling issue is regarded as important from the viewpoint of effective utilization of resources in response to a rise in environmental awareness. In this sense, the Al alloy solder material of the present invention is conceivable to be excellent. Namely, the solder alloy of the present invention is an alloy developed in consideration of recycling properties as well. In the alloy used for the Al alloy heat exchanger, the addition of Cu for the improvement of corrosion resistance of an alloy itself, that of Zn or the like for giving the sacrifice effect to the fin or the like, that of the large amount of Si to the solder, and that of Mn to the core material of the brazing sheet for the improvement of strength are performed on a member basis. When the heat exchanger manufactured from these members is melted and cast into scraps, an Al slab comes to have an average alloy composition containing all the elements, and is hard to be used as the raw material for the brazing sheet (solder material) which is adapted for a member of a renewedly manufactured heat exchanger. Thus, these scraps are eventually used for a low-cost casting alloy. However, this is no more than the reuse of the scraps. Preferably, a recycling in the true sense of the term is demanded, in which the scrapped heat exchanger is recycled for renewedly-manufactured heat exchanger members (the solder material and the brazing sheet or the like using this solder material) from the viewpoint of a saving of resources.

Judging from this point of view, the solder alloy of the present invention contains Si, Cu, Zn, Mn, Fe, In and Sn as the alloying elements, and in other words, contains all the elements normally added in the members of the Al alloy heat exchanger manufactured according to the brazing method. Namely, the solder alloy material of the present invention makes it possible to recycle the scrapped Al alloy heat exchangers for the solder alloy material of the brazing sheet for the renewedly-manufactured heat exchanger member.

The solder alloy material of the present invention is manufactured mainly from the scraps described above, although it may be manufactured only by mixing Al base metal and the alloying elements together like the conventional method as a matter of course.

Table 1 shows the average alloy compositions of scrapped Al alloy heat exchangers using the brazing sheet and the scraps of the brazing sheet when manufactured in the factory.

The solder alloy material of the present invention is manufactured by the steps of additionally mixing a mass of these scraps, fresh Al base metal and alloying elements such as Mn, Cu, Si together and then melting and casting the mixture.

(2) Concerning the third aspect of the present invention

The third aspect of the present invention relates to a brazing sheet for a fin of a heat exchanger.

Specifically, the third aspect of the present invention relates to a brazing sheet which is used for a fin of a heat exchanger and comprises a core material made of an Al-Si- Fe or Al-Si-Fe-Cu-Mn alloy, wherein both surfaces of the core material are clad with an Al alloy solder material having a composition containing Si in an amount of more than 7.0 to 12.0% or less by weight, Cu in an amount of more than 0.4 to 8.0% or less by weight, Zn in an amount of more than 0.5 to 6.0% or less by weight, Mn in an amount of more than 0.05 to 1.2% or less by weight and Fe in an amount of more than 0.05 to 0.5% or less by weight, or at need, one or both of In and Sn respectively in an amount of 0.3% or less by weight, with the remainder being Al and inevitable impurities.

The brazing sheet used for the fin of the heat exchanger according to the present invention is structured such that both surfaces of the core material made of the Al-Si-Fe or Al-Si-Fe-Cu-Mn alloy are clad with the solder material of the present invention. However, since the solder material has been described in the foregoing, a description will now be given of the Al alloy composition of the core material used for the brazing sheet adapted for the fin.

The core material used in the present invention is made of the Al-Si-Fe or Al-Si-Fe-Cu-Mn alloy.

The Al-Si-Fe alloy core material is used in case of particularly manufacturing a fin material excellent in heat conductivity. This alloy preferably includes an Al alloy having a composition containing Si in an amount of more than 0.05 to 2.5% or less by weight and Fe in an amount of more than 0.05 to 2.0% or less by weight, or an Al alloy having a composition containing one or two or more of Zn in an amount of 0.05 to 5.0% by weight, In in an amount of 0.002 to 0.3% by weight and Sn in an amount of 0.002 to 0.3% by weight in addition to the elements in the above Al alloy, or an Al alloy having a composition selectively containing a small amount of Mg, Cu, Mn, Ni, Cr, Zr or Ti at need in addition to the elements in the above Al alloys.

The Al-Si-Fe-Cu-Mn alloy core material is used in case of particularly manufacturing a fin material having high strength. This alloy preferably includes an Al alloy having a composition containing Si in an amount more than 0.05 to 2.5% or less by weight, Fe in an amount of more than 0.05 to 2.0% or less by weight, Cu in an amount of more than 0.05 to 2.0% or less by weight, and Mn in an amount of more than 0.6 to 2.0% or less by weight, or an Al alloy having a composition containing Zn, In, Sn, Mg, Ni, Cr, Zr and Ti in addition to the elements of the above Al alloy in similar to the above case.

As shown in FIG. 8, the brazing sheet for the fin of the present invention is worked into a corrugate fin, which is brazed at temperatures in the range from 570° to 585° C. and then used as the fin 32 of the condenser 30.

In this case, even though the core material contains Si in an amount of 1.2 or more to 2.5% or less by weight and Cu in an amount of 1.2 or more to 2.0% or less by weight, the fin is not melted nor buckled. Thus, it is possible to provide a fin material thinner than the conventional fin material.

(3) Concerning the fourth to sixth aspects of the present invention

The fourth to sixth aspects of the present invention relate to a brazing sheet for a fluid passage constituent member of a heat exchanger.

Specifically, the fourth aspect of the present invention relates to a brazing sheet which is used for a fluid passage constituent member of a heat exchanger and comprises a core material made of an Al-Si-Fe-Cu-Mn alloy, wherein one surface of the core material constituting the outside of a fluid passage of the heat exchanger is clad with an Al alloy solder material having a composition containing Si in an amount of more than 7.0 to 12.0% or less by weight, Cu in an amount of more than 0.4 to 8.0% or less by weight, Zn in an amount of more than 0.5 to 6.0% or less by weight, Mn in an amount of more than 0.05 to 1.2% or less by weight and Fe in an amount of more than 0.05 to 0.5% or less by weight, or at need, one or both of In and Sn respectively in an amount of 0.3% or less by weight, with the remainder being Al and inevitable impurities, and the other surface of the core material constituting the inside of the fluid passage is clad with an Al alloy sacrifice material.

In this case, the fluid passage constituent member of the heat exchanger corresponds to the tube 1, the header 3 or the like of the radiator 10 as shown in FIG. 1, or the tube or other members of a water-cooled oil cooler (not shown).

The brazing sheet for the fluid passage constituent member is structured such that one surface (i.e., surface C corresponding to the outside of the fluid passage) of the core material 61 is clad with the solder material 62, and the other surface (i.e., surface D corresponding to the inside of the fluid passage) is clad with the sacrifice material 63, as shown in FIG. 3. In this case, water is used as the fluid, and the brazing sheet is used such that the sacrifice material 63 is located on the water side.

As described above, the brazing sheet of the present invention is structured such that one surface of the Al-Si-Fe-Cu-Mn alloy core material is clad with the solder material of the present invention, and the other surface is clad with the sacrifice material. However, since the solder material has been described in the foregoing, a description will now be given of the Al alloy composition of the core material and that of the sacrifice material.

The Al-Si-Fe-Cu-Mn alloy core material used for the brazing sheet preferably includes an Al alloy having a composition containing Si in an amount of more than 0.2 to 2.5% or less by weight, Fe in an amount of more than 0.05 to 2.0% or less by weight, Cu in an amount of more than 0.05 to 2.5% or less by weight and Mn in an amount of more than 0.05 to 2.0% or less by weight, or an Al alloy having a composition selectively containing a small amount of Ni, Mg, Cr, Zr or Ti at need in addition to the elements of the above Al alloy.

Incidentally, Cu is added to the core material in an amount of more than 0.05 to 2.5% or less by weight (when exceeds 2.5% by weight, the core material is melted due to heating for brazing) for the improvement of strength. Alternately, when a highly-corrosive fluid (i.e., water) is used as the fluid flowing through the fluid passage, the content of Cu in the core material is preferably set to be in the range from more than 0.05 to 1.2% or less by weight.

Namely, water is used as the fluid for the radiator, for instance, and a deicing agent such as ethylene glycol or a corrosion prevention agent such as phosphoric acid and benzoic acid is ordinarily added to water depending on a region. However, when water is not treated in this manner, in other words, when there is a possibility that regular water containing no corrosion prevention agent is used, the inside (fluid side) of the radiator is easily corroded. Thus, considering the corrosion resistance, the content of Cu in the core material of the brazing sheet for the tube and header or like member is set to be within the range from more than 0.05 to 1.2% or less by weight.

Further, the sacrifice material is used for the brazing sheet in order to enhance the corrosion resistance on the inside. An alloy for the sacrifice material preferably includes an Al alloy having a composition containing one or two or more of Zn in an amount of more than 0.05 to 6.0% or less by weight, In in an amount of more than 0.001 to 0.3% or less by weight and Sn in an amount of more than 0.001 to 0.3% or less by weight, with the remainder being Al and inevitable impurities, or an Al alloy having a composition containing one or both of Mg in an amount of more than 0.05 to 2.5% or less by weight and Mn in an amount of more than 0.05 to 1.6% or less by weight at need in addition to the elements of the above Al alloy.

In use, the brazing sheet for the fluid passage constituent member of the present invention is formed into each heat exchanger member having a predetermined shape, which is then assembled into the heat exchanger by means of brazing at temperatures in the range from 570° to 585° C.

In this case, the core material is a high-strength material containing Si in an amount of 2.5% or less by weight and Cu in an amount of 2.5% or less by weight, and is satisfactorily brazed without melting. Thus, it is possible to provide a brazing sheet thinner than the conventional sheet.

Specifically, the fifth aspect of the present invention relates to a brazing sheet which is used for a fluid passage constituent member of a heat exchanger and comprises a core material made of an Al-Si-Fe-Cu-Mn alloy, wherein one surface of the core material constituting the outside of a fluid passage of the heat exchanger is clad with an Al alloy solder material having a composition containing Si in an amount of more than 7.0 to 12.0% or less by weight, Cu in an amount of more than 0.4 to 8.0% or less by weight, Zn in an amount of more than 0.5 to 6.0% or less by weight, Mn in an amount of more than 0.05 to 1.2% or less by weight and Fe in an amount of more than 0.05 to 0.5% or less by weight, or at need, one or both of In and Sn respectively in an amount of 0.3% or less by weight, with the remainder being Al and inevitable impurities.

The brazing sheet for the fluid passage constituent member as the fifth aspect of the present invention is used as the tube, header or the like of the radiator, or the tube and other members of the water-cooled oil cooler (not shown), similarly to the brazing sheet as the fourth aspect of the present invention.

The brazing sheet for the fluid passage constituent member as the fifth aspect of the present invention is similar to the brazing sheet 6 shown in FIG. 3 except that the sacrifice material 63 is not provided. In this case, water is used as the fluid, and the brazing sheet is used such that the core material is in contact with the fluid (water).

Thus, this brazing sheet is used in case where the fluid (water) is satisfactorily treated as described above, and the corrosion is relatively less liable to occur due to the fluid (water).

The alloy compositions of the solder material and the core material of the brazing sheet as the fifth aspect of the present invention are similar to those of the solder material and the core material of the brazing sheet as the fourth aspect of the present invention.

Thus, how to use the brazing sheet as the fifth aspect of the present invention, and its operation and effects are also similar to those of the brazing sheet as the fourth aspect of the present invention.

Specifically, the sixth aspect of the present invention relates to a brazing sheet which is used for a fluid passage constituent member of a heat exchanger and comprises a core material made of an Al-Si-Fe-Cu-Mn alloy, wherein both surfaces (i.e., surfaces respectively constituting the outside and inside of a fluid passage of the heat exchanger) of the core material are clad with an Al alloy solder material having a composition containing Si in an amount of more than 7.0 to 12.0% or less by weight, Cu in an amount of more than 0.4 to 8.0% or less by weight, Zn in an amount of more than 0.5 to 6.0% or less by weight, Mn in an amount of more than 0.05 to 1.2% or less by weight and Fe in an amount of more than 0.05 to 0.5% or less by weight, or at need, one or both of In and Sn respectively in an amount of 0.3% or less by weight, with the remainder being Al and inevitable impurities.

The fluid passage constituent member of the heat exchanger as the sixth aspect of the present invention corresponds to the fluid passage constituent member 21 or the like of the evaporator 20 as shown in FIG. 4. In this case, freon is used as the fluid.

Further, the members of the radiator 10 shown in FIG. 1 are also regarded as this fluid constituent member. In this case, water is used as the fluid.

The brazing sheet for the fluid passage constituent member is structured such that one surface (i.e., surface C corresponding to the outside of the fluid passage) of the core material 24 is clad with the solder material 25, and the other surface (i.e., surface D corresponding to the inside of the fluid passage) is clad with the solder material 25', as shown in FIG. 7.

The alloy compositions of the solder material and the core material of the brazing sheet as the sixth aspect of the present invention are similar to those of the solder material and the core material as the fourth aspect of the present invention.

It is preferable that the content of Cu in the core material is set to be in the range from more than 0.05 to 1.2% or less by weight in case of using water as the fluid while it is set to be in the range from more than 1.2 to 2.5% or less by weight in case of using freon as the fluid for the above reasons.

How to use the brazing sheet as the sixth aspect of the present invention, and its operation and effects are approximately similar to those of the brazing sheet as the fourth and fifth aspects of the present invention.

(4) Concerning the seventh aspect of the present invention

Specifically, the seventh aspect of the present invention relates to a method of manufacturing an Al alloy heat exchanger, which comprises the steps of forming the brazing sheet as defined in one of the third to sixth aspects of the present invention into predetermined members of the heat exchanger, and then assembling these members into the heat exchanger by means of brazing at temperatures in the range from 570° to 585° C.

As a matter of course, this method is adapted for manufacturing the Al alloy heat exchanger by the steps of forming various brazing sheets described above into the predetermined members of the heat exchanger, then assembling these members into the heat exchanger, and heating the assembled heat exchanger at temperatures in the range from 570° to 585° C. for brazing.

In this manner, brazing is performed at a temperature (570° to 585° C.) considerably lower than the conventional brazing temperature (about 600° C.), and therefore, various effects as described above can be obtained.

When the brazing temperature is 570° C. or less, the solder of the present invention is not melted depending on its composition, nor used for brazing. On the other hand, when the brazing temperature exceeds 585° C., not only the thermal conductivity of the material but also anti-buckling properties of the fin at a high temperature are degraded, and besides, an alloy having a low melting point or that containing the large amount of Cu is hard to be used for the core material of the fluid passage constituent member.

Incidentally, the brazing temperature is lowered in this manner, and as a result, the effect of extending the life of a brazing furnace is expected.

The brazing conditions other than the heating temperature may be almost similar to the conventional brazing conditions. For instance, a flux brazing method, a non-corrosion brazing method using a non-corrosive flux and so on can be applied. It is a matter of course that the above methods are not restrictive in particular, and other methods are also applicable. Further, the assembly or cleaning process before brazing may be performed as usual. Flux may be coated as usual according to circumstances. When a low-melting point flux containing fluoride or a flux containing cesium is used in this case, it is possible to perform brazing in the temperature range of the present invention.

Further, the processes after heating for brazing are not restrictive in particular. The aging, flux removal and coating process or the like may be performed as usual.

Incidentally, the brazing sheet described above has a thickness in the range from about 0.05 to 3 mm depending on its purpose. However, since the high strength Al alloy is used as the core material for the above reasons, it is possible to make the brazing sheet is made thinner than the conventional brazing sheet. The clad rate of the solder material is in the range from about 1 to 20%, and is varied depending on the thickness and purpose of the solder material. The clad rate is generally lessened according as the thickness of the sheet is increased.

The refining of the brazing sheet according to the present invention is not particularly defined. Considering the formability or the like, an arbitrary one may be selected out of O-material, H1n-material, H2n-material and H3n-material or the like.

Although not limited, the brazing sheet of the present invention is mainly used as the tube, header and fin members of the heat exchanger. Alternately, the brazing sheet of the present invention can be also used for other members of the heat exchanger, or be fit for various uses other than the heat exchanger.

BRIEF DESCRIPTION OF THE DRAWINGS

The foregoing and other objects and features of the invention will become apparent from the following description of preferred embodiments of the invention with reference to the accompanying drawings, in which.

Figure 1:
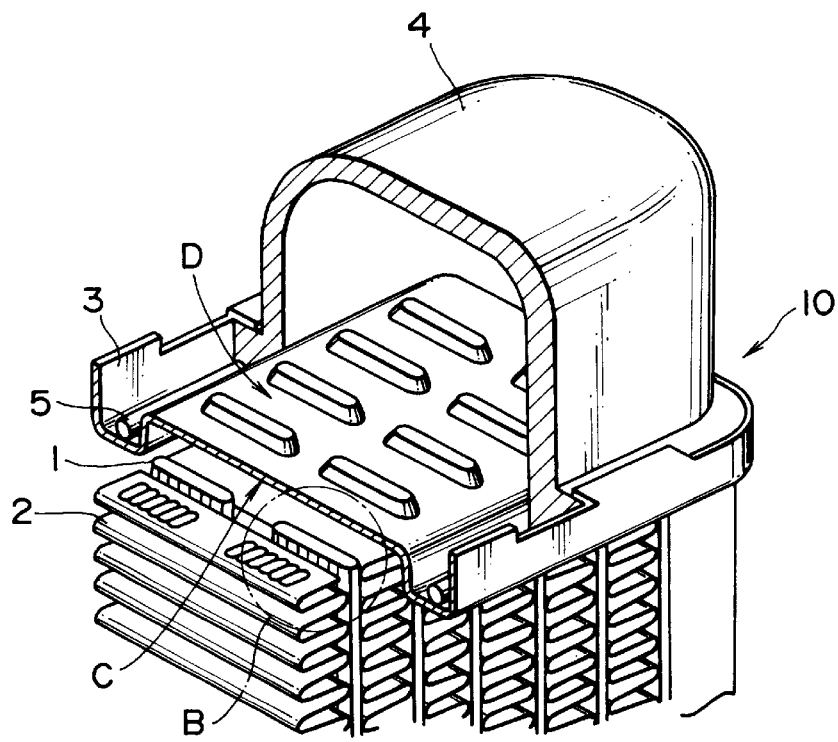
FIG. 1 is a perspective view, partly in section, showing a heat exchanger (radiator) as an embodiment.
Figure 2:
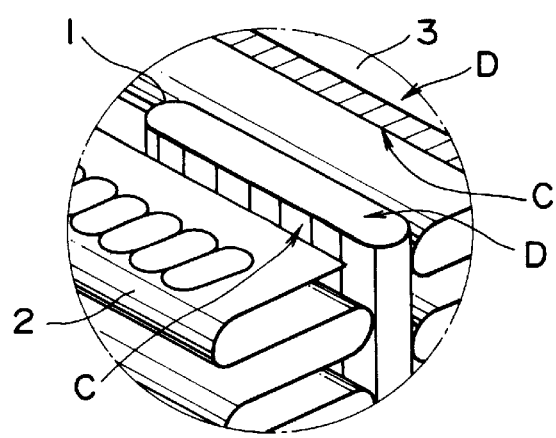
FIG. 2 is an enlarged-scale view showing a portion B in FIG. 1.
Figure 3:
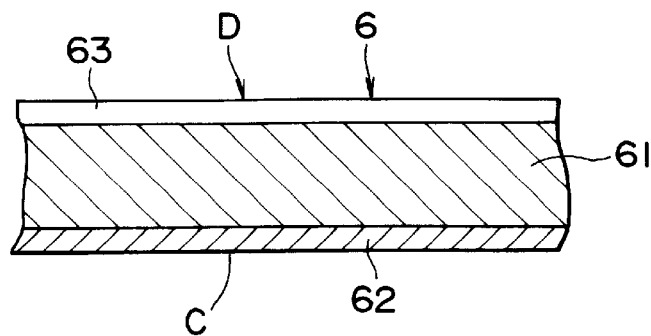
FIG. 3 is a view showing a sectional structure of a brazing sheet for a member of a flat tube, a header or the like of a radiator.
Figure 4:
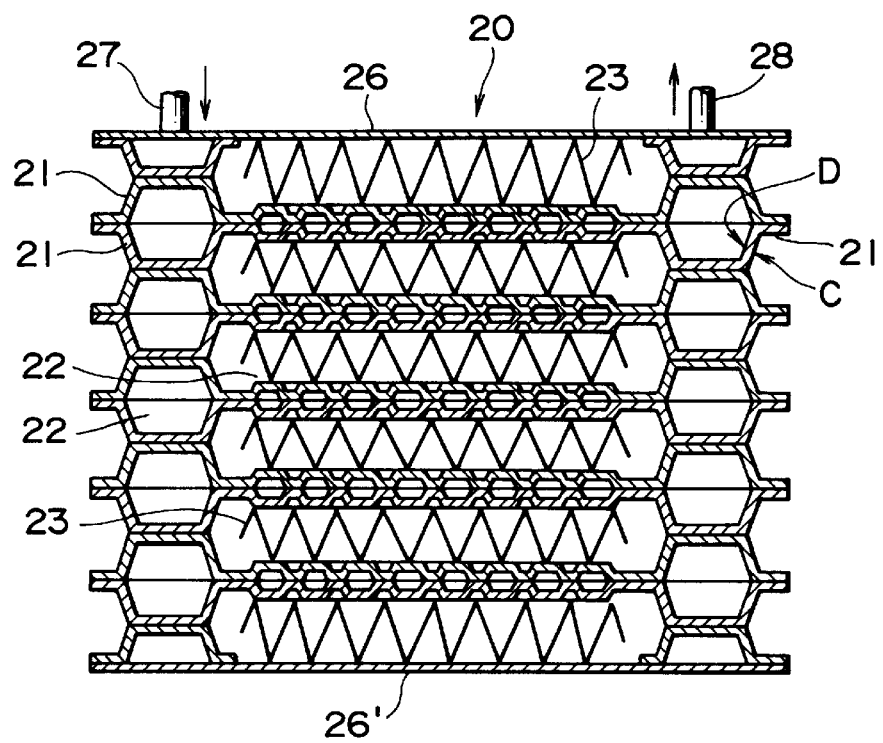
FIG. 4 is a schematic sectional view for explaining a heat exchanger (drawn cup evaporator) as an embodiment.
Figure 5:
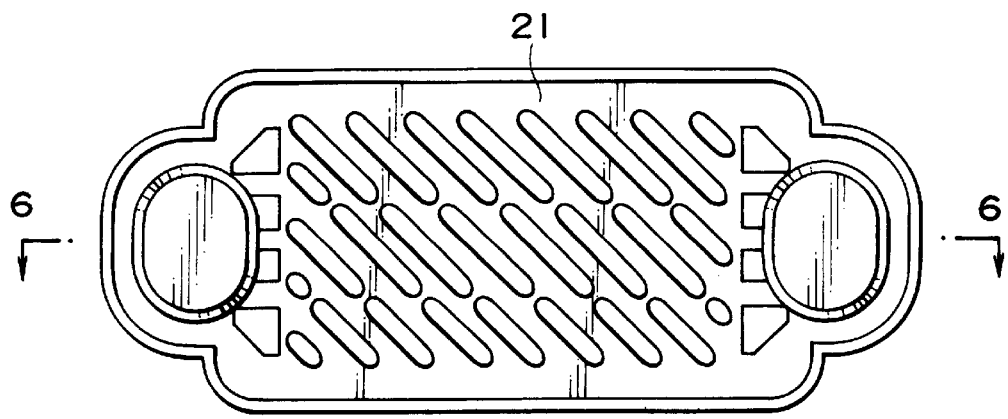
FIG. 5 is a plan view showing a fluid (freon) passage member 21 made of a brazing sheet.
Figure 6:
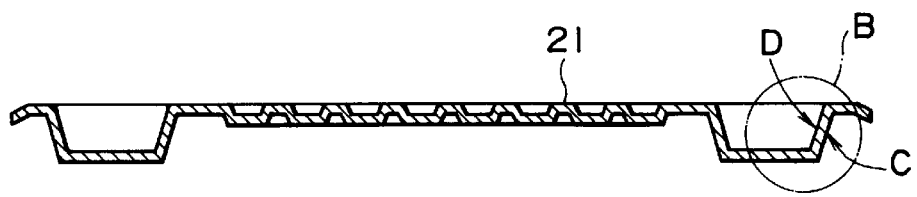
FIG. 6 is a sectional view taken along a line A—A' in FIG. 5.
Figure 7:
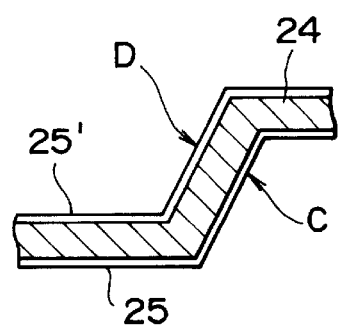
FIG. 7 is an enlarged-scale sectional view showing a portion B of the fluid passage member 21 shown in FIG. 6.
Figure 8:
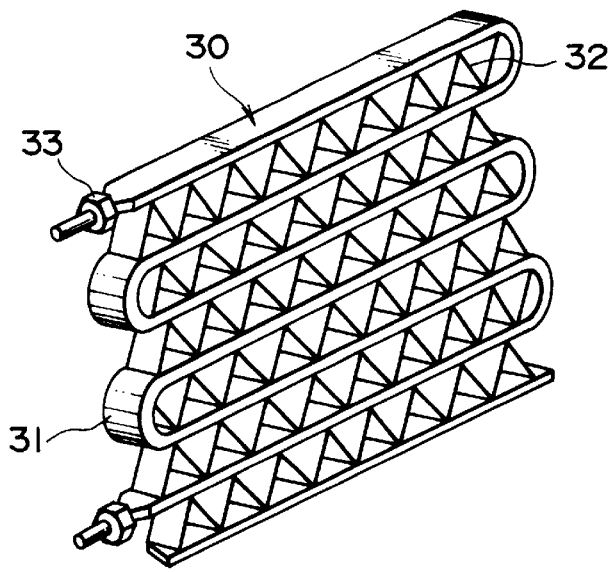
FIG. 8 is a perspective view showing a heat exchanger (serpentine-type condenser) as an embodiment.
Figure 9:
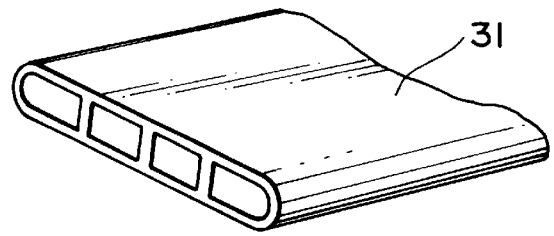
FIG. 9 is an enlarged-scale perspective view including a section of an extruded flat porous tube 31 shown in FIG. 8.
Figure 10:
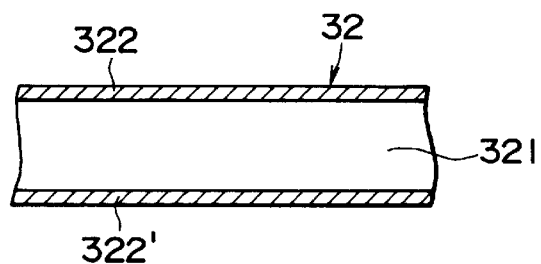
FIG. 10 is an enlarged-scale sectional view showing a fin member 32 made of a brazing sheet shown in FIG. 8.

DESCRIPTION OF THE PREFERRED EMBODIMENTS
(EXAMPLE 1)

This example mainly relates to a brazing sheet for a fin of a heat exchanger and is concerned with claims 1, 2, 3 and 6.

Table 1 shows the average alloy composition of brazing sheet scraps produced when the brazing sheet is manufactured in a factory,.and that of scrapped Al alloy heat exchangers including the brazing sheets, in case where the brazing sheet scraps and the scrapped Al alloy heat exchangers are melted and cast.

TABLE 1

| | Kind of scraps of | Average alloy composition (wt. %) when melted | | | | | |
|---|---|---|---|---|---|---|---|
| No. | brazing material | Si | Fe | Cu | Mn | Zn | Al |
| 1 | Scraps of brazing sheet for fin when produced in factory | 2.5 | 0.2 | 0.1 | 1.0 | 1.2 | Remainder |
| 2 | Scraps of brazing sheet for tube when produced in factory | 2.0 | 0.2 | 0.5 | 1.0 | 0.3 | Remainder |
| 3 | Scrapped Al-alloy heat exchanger | 1.8 | 0.3 | 0.3 | 1.0 | 0.5 | Remainder |

Incidentally, in Table 1, the scraps of brazing sheets for fins when manufactured in the factory mainly include scraps of brazing sheets or the like structured such that both surfaces of an Al-Mn-Zn alloy core material are clad with an Al-Si alloy solder material as a skin material.

The scraps of brazing sheets for tubes when manufactured in the factory mainly include scraps of brazing sheets or the like structured such that one surface of an Al-Mn-Cu alloy core material is clad with an Al-Si alloy solder material, and the other surface is clad with an Al-Zn alloy as a sacrifice material.

The scrapped heat exchangers include a scrapped Al alloy radiator composed of a tube material, a header material, a fin material made of an Al-Mn-Zn alloy and others. In this case, the tube material and the header material are respectively structured such that one surface of an Al-Mn-Cu alloy core material is clad with an Al-Si alloy solder material and the other surface is clad with an Al-Zn alloy as a sacrifice material.

Scrap alloys (Nos. 1, 2 and 3) shown in Table 1 were mixed together to prepare solder alloy materials having various compositions shown in Table 2, which were then melted and cast.

Incidentally, each of solder alloy materials Nos. 1 to 12 in Table 2 was prepared as a solder alloy material having a predetermined composition by adding Al base metal, and further Si, Cu, Zn or the like to the above scrap material. In manufacture of solder alloy materials (Nos. 13 to 16) as some of comparative examples in Table 2 and conventional solder materials (Nos. 17 and 18), the scrap materials could not be used under the influence of the scrap composition.

These solder alloy sheets serving as the skin material were manufactured according to a normal process including DC casting, chamfering, homogenization and hot rolling steps.

Subsequently, each resultant solder alloy sheet was combined with an alloy slab as a core material having an alloy composition shown in Table 2 and then attached to both surfaces of the core material. The core material and the solder alloy sheet were heated and hot-rolled into a clad sheet. Further, the clad sheet was cold-rolled and annealed according to a normal process into a refined sheet having a predetermined thickness, as a brazing sheet for a fin, in which both surfaces of the core material are clad with the solder material. Table 2 shows the combination of the solder material and the core material of each of the brazing sheets Nos. 1 to 18.

shown in Table 3, and the drooping amount of the fin material was measured.

The drooping test was made on condition that the projection length of a sample having a width of 22 mm is set to 50 mm. This sample was heated on the above heating conditions and then cooled down to room temperature to measure the amount of drooping of the sample. The results thus obtained are shown in Table 3.

TABLE 2

Brazing sheet for fin

| | | Alloy composition (wt. %) of solder material | | | | | | | Kind of available scraps |
|---|---|---|---|---|---|---|---|---|---|
| | No. | Si | Fe | Cu | Mn | Zn | In | Sn | Al | (No. in Table 1) |
| Example of present invention | 1 | 9.5 | 0.2 | 0.8 | 0.6 | 4 | — | — | Remainder | 1 |
| | 2 | 10.0 | 0.3 | 0.8 | 0.1 | 1.2 | 0.01 | — | Remainder | 2 |
| | 3 | 10.5 | 0.2 | 0.6 | 0.3 | 5 | — | — | Remainder | 1 |
| | 4 | 10.0 | 0.5 | 0.8 | 0.3 | 3 | — | 0.01 | Reaminder | 1 |
| | 5 | 9.5 | 0.2 | 0.8 | 0.6 | 4 | — | — | Remainder | 1 |
| | 6 | 10.5 | 0.2 | 0.6 | 0.1 | 2 | — | — | Remainder | 3 |
| | 7 | 9.5 | 0.2 | 0.8 | 0.6 | 4 | — | — | Remainder | 1 |
| | 8 | 10.5 | 0.2 | 0.6 | 0.3 | 5 | — | — | Remainder | 1 |
| | 9 | 9.5 | 0.2 | 0.8 | 0.6 | 4 | — | — | Remainder | 1 |
| | 10 | 10.0 | 0.3 | 0.8 | 0.1 | 1.2 | 0.01 | — | Remainder | 2 |
| Comparative example | 11 | 6.0 | 0.3 | 0.8 | 0.6 | 1.0 | — | — | Remainder | 2 |
| | 12 | 11.0 | 0.3 | 9.0 | 1.0 | 8.0 | — | — | Remainder | 1 |
| | 13 | 6.0 | 0.5 | 0.6 | — | 0.02 | — | — | Remainder | — |
| | 14 | 11.0 | 0.3 | 0.01 | — | 0.02 | — | — | Remainder | — |
| | 15 | 9.8 | 0.7 | — | — | — | — | — | Remainder | — |
| | 16 | 9.8 | 0.7 | — | — | — | — | — | Remainder | — |
| Conventional example | 17 | 9.8 | 0.7 | — | — | — | — | — | Remainder | — |
| | 18 | 9.8 | 0.7 | — | — | — | — | — | Remainder | — |

| | | Alloy composition (wt. %) of core material | | | | | | | | |
|---|---|---|---|---|---|---|---|---|---|---|
| | No. | Si | Fe | Cu | Mn | Zr | Ti | Ni | Zn | In | Al |
| Example of present invention | 1 | 0.2 | 0.5 | 0.04 | 1.1 | — | 0.01 | — | 1.1 | — | Remainder |
| | 2 | 0.2 | 0.5 | 0.04 | 1.1 | — | 0.01 | — | 1.1 | — | Remainder |
| | 3 | 0.2 | 0.5 | 0.04 | 1.1 | — | 0.01 | — | 1.1 | — | Remainder |
| | 4 | 0.2 | 0.5 | 0.04 | 1.1 | — | 0.01 | — | 1.1 | — | Remainder |
| | 5 | 0.15 | 0.6 | — | — | 0.15 | 0.01 | — | 1.1 | — | Remainder |
| | 6 | 0.15 | 0.6 | — | — | 0.15 | 0.01 | — | 1.1 | — | Remainder |
| | 7 | 0.5 | 1.3 | — | — | 0.05 | 0.01 | 0.6 | 1.0 | — | Remainder |
| | 8 | 0.5 | 1.3 | — | — | 0.05 | 0.01 | 0.6 | 1.0 | — | Remainder |
| | 9 | 1.4 | 0.3 | 0.4 | 1.1 | 0.15 | 0.01 | — | 2.0 | 0.01 | Remainder |
| | 10 | 1.4 | 0.3 | 0.4 | 1.1 | 0.15 | 0.01 | — | 2.0 | 0.01 | Remainder |
| Comparative example | 11 | 0.2 | 0.5 | 0.04 | 1.1 | — | 0.01 | — | 1.1 | — | Remainder |
| | 12 | 0.2 | 0.5 | 0.04 | 1.1 | — | 0.01 | — | 1.1 | — | Remainder |
| | 13 | 0.2 | 0.5 | 0.04 | 1.1 | — | 0.01 | — | 1.1 | — | Remainder |
| | 14 | 0.15 | 0.6 | — | — | 0.15 | 0.01 | 0.6 | 1.1 | — | Remainder |
| | 15 | 0.5 | 1.3 | — | — | 0.05 | 0.01 | 0.6 | 0.8 | — | Remainder |
| | 16 | 1.4 | 0.3 | 0.4 | 1.1 | 0.15 | 0.01 | — | 2.0 | 0.01 | Remainder |
| Conventional example | 17 | 0.2 | 0.5 | 0.04 | 1.1 | — | 0.01 | — | 1.1 | — | Remainder |
| | 18 | 0.15 | 0.6 | — | — | 0.15 | 0.01 | — | 1.1 | — | Remainder |

Note) Both surfaces of core material are clad with solder material.

The resultant brazing sheet for the fin is H14 refined material having a thickness of 0.10 mm. The clad rate of the solder material is set to be 10% of the whole sheet thickness per one surface.

The fin brazing sheet having the thickness of 0.10 mm was heated for brazing under the presence of $N_2$ gas at 580° C. for 5 minutes (as examples of the present invention), at 600° C. for 5 minutes (as conventional examples) and at 600° to 610° C. for 5 minutes (as comparative examples) as

TABLE 3

| | Alloy No. | Heating test conditions (temperature and time) | Amount of drooping |
|---|---|---|---|
| Example of present invention | 1 | 580° C. × 5 min. | 6 mm |
| | 2 | 580° C. × 5 min. | 6 mm |
| | 3 | 580° C. × 5 min. | 6 mm |
| | 4 | 580° C. × 5 min. | 6 mm |

TABLE 3-continued

|  | Alloy No. | Heating test conditions (temperature and time) | Amount of drooping |
|---|---|---|---|
|  | 5 | 580° C. × 5 min. | 8 mm |
|  | 6 | 580° C. × 5 min. | 8 mm |
|  | 7 | 580° C. × 5 min. | 8 mm |
|  | 8 | 580° C. × 5 min. | 8 mm |
|  | 9 | 580° C. × 5 min. | 9 mm |
|  | 10 | 580° C. × 5 min. | 9 mm |
| Comparative | 11 | 610° C. × 5 min. | 40 mm |
| example | 12 | Immpossible to manufacture fin | |
|  | 13 | 610° C. × 5 min. | 40 mm |
|  | 14 | 600° C. × 5 min. | 35 mm |
|  | 15 | 600° C. × 5 min. | 35 mm |
|  | 16 | 600° C. × 5 min. | 40 mm |
| Conventional | 18 | 600° C. × 5 min. | 25 mm |
| example | 18 | 600° C. × 5 min. | 35 mm |

Since the composition of each fin material as the comparative example is outside the composition range of the solder alloy of the present invention, these fin materials could not be rolled into fins. In addition, since the solder material has a high melting point, its brazing temperature becomes higher than the brazing temperature (570° to 585° C.) of the present invention, and as a result, the large amount of drooping was measured in the comparative examples. Further, the large amount of drooping was measured in the conventional examples as well. On the other hand, the fin material made of the solder alloy of the present invention is extremely superior in drooping characteristics to the conventional examples and the comparative examples.

For this reason, the reduction of the thickness of the brazing sheet for the fin according to the present invention is expected more than that of the conventional brazing sheet.

(EXAMPLE 2)

This example mainly relates to a brazing sheet for a fluid passage member of a heat exchanger, and is concerned with claims 1, 2, 4 and 6.

Incidentally, the fluid passage member of the heat exchanger includes a tube material and a header material or the like in case of the radiator, while it includes a tube material or the like in case of the oil cooler, for instance. Further, water is used as the fluid in this case. The brazing sheet in this example is a three-layer material, in which the inside (water side) of the core material is clad with an Al alloy sacrifice material.

A three-layer sheet material composed of the Al alloy solder material and the core material respectively having the alloy compositions shown in Table 4 and the sacrifice material was used to manufacture a brazing sheet (with a thickness of 0.25 mm) for a tube of the radiator according to a normal method. The clad rate of the solder material is set to be 10% of the whole sheet thickness. Further, the sacrifice material is made of an Al-Zn alloy with the content of Zn in an amount of 4% by weight, and its clad rate is set to be 15% of the whole sheet thickness. On the other hand, the sacrifice material as the conventional example is made of an Al-Zn alloy with the content of Zn in an amount of 1% by weight, and its clad rate is set to be 10% of the whole sheet thickness. Further, Fe and Si respectively in an amount of 0.01 to 0.2% by weight are contained as impurity elements in the sacrifice material.

Incidentally, the Al alloy solder material used for the brazing sheet was manufactured using the scraps shown in Table 1 as the raw material similarly to the example 1.

TABLE 4

Brazing sheet for fluid passage member

|  |  | Alloy composition (wt. %) of solder material | | | | | | | Kind of available scraps | Alloy composition (wt. %) of core material | | | | | |
|---|---|---|---|---|---|---|---|---|---|---|---|---|---|---|---|
|  | No. | Si | Fe | Cu | Mn | Zn | In | Sn | Al | (No. in Table 1) | Si | Fe | Cu | Mn | Ti | Al |
|  | 21 | 9.5 | 0.2 | 0.8 | 0.6 | 4 | — | — | Remainder | 1 | 1.2 | 0.3 | 1.4 | 1.1 | 0.18 | Remainder |
|  | 22 | 10.0 | 0.3 | 0.8 | 0.1 | 1.2 | 0.01 | — | Remainder | 2 | 1.3 | 0.3 | 1.4 | 1.1 | 0.18 | Remainder |
|  | 23 | 10.5 | 0.2 | 0.6 | 0.3 | 5 | — | — | Remainder | 1 | 1.3 | 0.3 | 1.4 | 1.1 | 0.18 | Remainder |
|  | 24 | 10.0 | 0.5 | 0.8 | 0.3 | 3 | — | 0.01 | Remainder | 1 | 1.3 | 0.3 | 1.4 | 1.1 | 0.18 | Remainder |
|  | 25 | 10.5 | 0.2 | 0.6 | 0.1 | 2 | — | — | Remainder | 3 | 1.3 | 0.3 | 1.4 | 1.1 | 0.18 | Remainder |
|  | 26 | 9.5 | 0.2 | 0.8 | 0.6 | 4 | — | — | Remainder | 1 | 0.8 | 0.3 | 0.8 | 1.1 | 0.18 | Remainder |
|  | 27 | 10.5 | 0.2 | 0.6 | 0.3 | 5 | — | — | Remainder | 1 | 0.8 | 0.3 | 0.8 | 1.1 | 0.18 | Remainder |
|  | 28 | 9.5 | 0.2 | 0.8 | 0.6 | 4 | — | — | Remainder | 1 | 0.5 | 0.4 | 0.5 | 1.1 | 0.01 | Remainder |
| Comparative | 29 | 10.0 | 0.6 | 0.8 | 0.3 | — | — | — | Remainder | — | 1.3 | 0.3 | 1.4 | 1.1 | 0.18 | Remainder |
| example | 30 | 11.0 | 0.4 | 0.01 | — | 5.0 | — | — | Remainder | — | 1.3 | 0.3 | 1.4 | 1.1 | 0.18 | Remainder |
|  | 31 | 6.0 | 0.5 | 0.6 | — | 0.02 | — | — | Remainder | — | 1.3 | 0.3 | 1.4 | 1.1 | 0.18 | Remainder |
|  | 32 | 9.8 | 0.7 | — | — | — | — | — | Remainder | — | 1.3 | 0.3 | 1.4 | 1.1 | 0.18 | Remainder |
|  | 33 | 10.0 | 0.4 | 0.2 | — | 2.0 | — | — | Remainder | — | 1.3 | 0.3 | 1.4 | 1.1 | 0.18 | Remainder |
| Conventional example | 34 | 9.8 | 0.7 | — | — | — | — | — | Remainder | — | 0.3 | 0.4 | 0.5 | 1.1 | 0.01 | Remainder |

Note) One surface of core material is clad with solder material, and the other surface is clad with sacrifice material.

On the conditions shown in Table 5, the brazing sheets were heated under the presence of $N_2$ gas. A tensile test and a corrosion resistance test were made on the resultant sheet material. An outside corrosion resistance test and an inside corrosion resistance test were made as the corrosion resistance test on condition that the solder material faces the outside and the sacrifice material faces the inside (i.e., water side).

CASS test (JISH8681) was made for 500 hours as the outside corrosion resistance test on condition that only the central surface portion on the solder material side is exposed, and other surface portions are all sealed. Then, the conditions of occurrence of pitting corrosion were examined.

The inside corrosion resistance test was made on condition that a sheet prepared by masking the solder material side and the sheet ends is immersed for 5 months in city water containing 10 ppm of $Cu^{2+}$ ion. Further, a cycle corrosion test is applied to the immersion. Namely, the sheet is cyclically immersed in the above city water at 80° C. for 8 hours, and then held at room temperature for 16 hours. The depth of pits (i.e., pitting corrosion depth) produced on the surface of the sheet on the side of the sacrifice material as the result of the immersion for 5 months was found according to a focal depth method using an optical microscope. The results thus obtained are shown in Table 5.

TABLE 5

|  | No. | Braze heating conditions (°C. × 5 min.) | Tensile strength (MPa) | Outside anti-corrosion maximum depth of pit corrosion ($\mu$m) | Inside anti-corrosion maximum depth of pit corrosion ($\mu$m) |
|---|---|---|---|---|---|
| Example of present invention | 21 | 580 | 200 | 100 | 70 |
|  | 22 | 580 | 200 | 100 | 70 |
|  | 23 | 580 | 200 | 100 | 70 |
|  | 24 | 580 | 200 | 100 | 70 |
|  | 25 | 580 | 200 | 100 | 70 |
|  | 26 | 580 | 180 | 90 | 70 |
|  | 27 | 580 | 180 | 90 | 70 |
|  | 28 | 580 | 160 | 120 | 70 |
| Comparative example | 29 | 580 | 200 | Occurence of through pitting corrosion | 70 |
|  | 30 | 580 | 200 | Occurence of through pitting corrosion | 70 |
|  | 31 | 600 |  | Impossible to measure due to melting |  |
|  | 32 | 600 |  | Impossible to measure due to melting |  |
|  | 33 | 580 | 200 | Occurence of through pitting corrosion | 70 |
| Conventional example | 34 | 600 | 160 | Occurrence of through pitting corrosion | Occurrence of through pitting corrosion |

With respect to a brazing sheet No. 29 as the comparative example, since its solder material does not contain Zn, In and Sn, the outside corrosion resistance is degraded. With respect to a brazing sheet No. 30 as the comparative example, since its solder material contains the small amount of Cu and does not contain Mn, the outside corrosion resistance is degraded. With respect to each of brazing sheets Nos. 31 and 32 as the comparative examples, its composition is outside the range of the solder alloy of the present invention. Since the solder is not melted at a temperature of 585° C. or less, each of these brazing sheets Nos. 31 and 32 was heated at a temperature of 600° C. or more, and as a result, its core material was melted. With respect to a brazing sheet No. 33 as the comparative example, since its solder material contains the small amount of Cu and does not contain Mn, the outside corrosion resistance is degraded. With respect to a brazing sheet as the conventional example, although its core material contains the relatively large amount of Cu, it is inferior in corrosion resistance. On the other hand, brazing sheets as the examples of the present invention enable the use of a high-strength material, and are excellent in corrosion resistance.

(EXAMPLE 3)

Similarly to the example 2, this example mainly relates to a brazing sheet for a fluid passage member (a tube material and a header material of the radiator or the like) of a heat exchanger and is concerned with claims 1, 2, 4 and 6.

A fin material, a tube material and a header plate material respectively having the Al alloy compositions shown in Table 6 were prepared. These materials other than the fin material are made of the brazing sheet.

Incidentally, an Al alloy solder material used for the brazing sheet in this example was manufactured using the scraps shown in Table 1 as the raw material similarly to the example 1.

The fin, tube and header plate materials were assembled together into the radiator shown in FIG. 1. A tube was prepared such that a strip material (a coiled sheet material) having a thickness of 0.3 mm shown in Table 6 was manufactured according to a normal method, and then slit into a strip material having a width of 35.0 mm, which was then formed into an electro-unite tube by means of an electro-unite tube manufacturing apparatus, and the electro-unite tube was further worked into a flat tube for a fluid (water) tube having a width of 16.0 mm and a height of 2.2 mm. The header plate was prepared such that a coiled sheet material having a thickness of 1.0 mm was slit into a strip material for a header having a width of 60 mm.

TABLE 6

| Name of member | Alloy composition (wt. %) of solder material | | | | | | | Mixture of scraps with solder material (No in Table I) | Alloy composition (wt. %) of core material | | | | | | | | Clad | Remarks |
|---|---|---|---|---|---|---|---|---|---|---|---|---|---|---|---|---|---|---|
| | Si | Fe | Cu | Mn | Zn | In | Al | | Si | Fe | Cu | Mn | Zn | Zr | Ti | Al | | |
| Fin ① | — | — | — | — | — | — | — | — | 0.2 | 0.5 | 0.05 | 1.1 | 1.0 | — | 0.01 | Remainder | Bare material | Thickness 0.06 mm |
| Fin ② | — | — | — | — | — | — | — | — | 1.10 | 0.65 | — | — | 1.0 | 0.15 | 0.01 | Remainder | Bare material | Thickness 0.06 mm |
| Tube ③ | 10.0 | 0.4 | 0.8 | 0.8 | 3.5 | 0.002 | Remainder | 1 | 1.4 | 0.5 | 0.8 | 1.1 | — | — | 0.11 | Remainder | One surface is clad with 10% solder. The other surface is clad with 15% alloy of Al-4% Zn | Electro-unite tube Thickness 0.3 mm |
| Tube ④ | 10.0 | 0.2 | 0.6 | 0.3 | 5.0 | — | Remainder | 2 | 1.5 | 0.5 | 1.5 | — | — | — | 0.11 | Remainder | One surface is clad with 10% solder. The other surface is clad with 15% alloy of Al-4% Zn | Electro-unite tube Thickness 0.3 mm |
| Tube ⑤ | 9.8 | 0.6 | — | — | — | — | Remainder | — | 0.3 | 0.5 | 0.15 | 1.1 | — | — | 0.01 | Remainder | One surface is clad with 10% solder. The other surface is clad with 15% alloy of Al-4% Zn | Electro-unite tube Thickness 0.3 mm |
| Tube ⑥ | 9.8 | 0.6 | — | — | — | — | Remainder | — | 1.6 | 0.5 | 0.5 | 1.1 | — | 0.15 | 0.10 | Remainder | One surface is clad with 10% solder. The other surface is clad with 15% alloy of Al-4% Zn | Electro-unite tube Thickness 0.3 mm |
| Header plate ⑦ | 10.0 | 0.4 | 0.8 | 0.8 | 3.5 | 0.002 | Remainder | 1 | 1.4 | 0.5 | 0.8 | 1.1 | — | — | 0.11 | Remainder | One surface is clad with 10% solder. The other surface is clad with 15% alloy of Al-4% Zn | Thickness 1 mm |
| Header plate ⑧ | 10.0 | 0.2 | 0.6 | 0.3 | 5.0 | — | Remainder | 2 | 1.5 | 0.5 | 1.5 | — | — | — | 0.11 | Remainder | One surface is clad with 10% solder. The other surface is clad with 15% alloy of Al-4% Zn | Thickness 1 mm |
| Header plate ⑨ | 9.8 | 0.6 | — | — | — | — | Remainder | — | 0.3 | 0.5 | 0.15 | 1.1 | — | — | 0.01 | Remainder | One surface is clad with 10% solder. The other surface is clad with 15% alloy of Al-4% Zn | Thickness 1 mm |
| Header plate ⑩ | 9.8 | 0.6 | — | — | — | — | Remainder | — | 1.6 | 0.5 | 0.5 | 1.1 | — | 0.15 | 0.10 | Remainder | One surface is clad with 10% solder. The other surface is clad with 15% alloy of Al-4% Zn | Thickness 1 mm |

The assembled radiator was coated with a solution containing a potassium fluoride flux at a concentration of 10%, and then heated for brazing under the presence of $N_2$ gas on conditions shown in Table 7. Table 7 shows a combination of the materials and the heating conditions. In this case, with respect to a sample of No. 46 as the comparative example, the tube was melted in heating for brazing. How the fin and the tube are crushed, and the formation of a fillet were examined on the obtained radiator by means of external observation. The results thus obtained are shown in Table 7. Further, the heat exchanger effectiveness was examined on each brazed heat exchanger, except the sample No. 46 as the comparative example. The test of heat exchanger effectiveness was made according to JIS D 1618 (a cooling equipment test method for an automobile). Table 7 shows to what extent the heat exchanger effectiveness of the present invention is improved in comparison with that of the conventional heat exchanger. The tensile test was made on each brazed tube material, except the sample No. 46 as the comparative example, and the result thus obtained are shown in Table 7.

Incidentally, the fluid passage member in this example corresponds to a fluid passage member of the heat exchanger and includes the tube and header materials in case of the radiator, while it includes the tube material or the like in case of the oil cooler. Water is supposed to be used as the fluid in either case.

In this example, on the supposition that water used for the radiator or the like is well treated, the brazing sheet was manufactured so as to contain the large amount (i.e., the range from 1.20 to 2.5% by weight) of Cu in its core material.

The brazing sheet of this example is a two-layer material, in which the outside of its core material is clad with a solder material, and the inside (i.e., water side) is clad with no material.

Similarly to the example 1, the scrap alloys shown in table 1 ware mixed together to prepare solder alloy materials having various compositions shown in Table 8, which were then melted and cast.

Incidentally, each of solder alloy materials Nos. A to O, R and S shown in Table 8 was prepared as a solder alloy

TABLE 7

|  | No. | Combination Fin | Tube | Plate | Braze heating temperature × 5 min. | Crushed portion | Brazing properties | Heat exchanger effectiveness | Tensile strength of tube |
|---|---|---|---|---|---|---|---|---|---|
| Example of present invention | 41 | ① | ③ | ⑦ | 580° C. | None | Excellent | Improved by 0.5%, compared with No. 44 | 190 MPa |
|  | 42 | ② | ③ | ⑦ | 580° C. | None | Excellent | Improved by 2.5%, compared with No. 44 | 190 MPa |
|  | 43 | ① | ④ | ⑧ | 580° C. | None | Excellent | Improved by 0.5%, compared with No. 44 | 170 MPa |
| Conventional example | 44 | ① | ⑤ | ⑨ | 600° C. | None | Excellent | Standard | 130 MPa |
| Comparative example | 45 | ② | ⑤ | ⑨ | 600° C. | Fin | Excellent | Degraded by 2.0%, compared with No. 44 | 130 MPa |
|  | 46 | ① | ⑥ | ⑩ | 600° C. | Tube | Excellent | Impossible to measure due to melting |  |

As is apparent from Table 7, according to the present invention, it is possible to manufacture a heat exchanger without crushing the fin, which attains a high strength, in heating. Further, the use of a high-strength material is enabled, and the manufactured radiator is excellent in heat exchanger effectiveness.

(EXAMPLE 4)

This example relates to a brazing sheet for a fluid passage member of a heat exchanger, and is concerned with claims 1, 2, 5 and 6.

material having a predetermined alloy composition by adding Al base metal and further Si, Cu, Zn or the like to the scrap materials described above. In manufacture of solder alloy materials (Nos. P and Q) as some of the comparative examples and a conventional solder alloy material (No.T), the scrap materials could not be used under the influence of the scrap composition.

These solder alloy sheets serving as the skin material were manufactured according to a normal method including DC casting, chamfering, homogenization and hot rolling steps.

TABLE 8

|  |  | Alloy composition (wt. %) of solder material | | | | | | | | Kind of available scraps |
|---|---|---|---|---|---|---|---|---|---|---|
|  | No. | Si | Fe | Cu | Mn | Zn | In | Sn | Al | (No. in Table 1) |
| Example of present invention | A | 10.4 | 0.19 | 0.84 | 0.22 | 2.4 | — | — | Remainder | 2 |
|  | B | 9.5 | 0.23 | 0.90 | 0.19 | 3.8 | — | — | Remainder | 1 |
|  | C | 10.8 | 0.22 | 1.23 | 0.59 | 2.5 | — | — | Remainder | 2 |
|  | D | 9.2 | 0.15 | 1.52 | 0.63 | 3.5 | — | — | Remainder | 2 |
|  | E | 8.5 | 0.25 | 2.49 | 0.21 | 2.1 | — | — | Remainder | 3 |
|  | F | 11.0 | 0.20 | 2.76 | 0.26 | 4.3 | — | — | Remainder | 2 |
|  | G | 10.2 | 0.23 | 2.65 | 0.63 | 1.9 | — | — | Remainder | 2 |
|  | H | 9.5 | 0.14 | 2.55 | 0.71 | 4.2 | — | — | Remainder | 2 |
|  | I | 9.3 | 0.46 | 2.41 | 0.25 | 4.5 | — | — | Remainder | 2 |

TABLE 8-continued

|  | No. | Si | Fe | Cu | Mn | Zn | In | Sn | Al | Kind of available scraps (No. in Table 1) |
|---|---|---|---|---|---|---|---|---|---|---|
|  | J | 11.2 | 0.18 | 6.18 | 0.68 | 4.0 | — | — | Remainder | 2 |
|  | K | 10.5 | 0.21 | 2.60 | 0.95 | 3.8 | — | — | Remainder | 3 |
|  | L | 11.0 | 0.17 | 0.81 | 0.73 | 0.9 | — | — | Remainder | 1 |
|  | M | 10.1 | 0.26 | 2.49 | 0.67 | 3.7 | 0.04 | — | Remainder | 2 |
|  | N | 10.2 | 0.25 | 2.58 | 0.24 | 4.2 | — | 0.03 | Remainder | 2 |
| Comparative example | O | 5.3 | 0.28 | 0.91 | 0.26 | 2.3 | — | — | Remainder | 2 |
|  | P | 11.1 | 0.21 | — | 0.21 | 3.9 | — | — | Remainder | — |
|  | Q | 10.4 | 0.17 | 0.85 | — | 2.1 | — | — | Remainder | — |
|  | R | 9.8 | 0.23 | 0.71 | 1.49 | 4.3 | — | — | Remainder | 2 |
|  | S | 10.5 | 0.22 | 2.64 | 0.25 | 0.1 | — | — | Remainder | 2 |
| Conventional example | T | 10.1 | 0.42 | — | — | — | — | — | Remainder | — |

Subsequently, each resultant solder alloy sheet was attached to one surface of an alloy slab as a core material having an alloy composition shown in Table 9, and the solder alloy sheet and the core material were heated and hot-rolled into a clad sheet. This clad sheet was further cold-rolled and annealed according to a normal method into a refined sheet having a predetermined thickness, as a brazing sheet having one surface clad with the solder material. Table 9 shows the alloy composition of the alloy slab as the core material, and Table 10 shows the constitution of the brazing sheet.

Two kinds of brazing sheets consisting of H14 refined material having a thickness of 0.25 mm and O material having a thickness of 1.0 mm were manufactured. The clad rate of the solder material is set to be 10% in case of the material having the thickness of 0.25 mm, while being set to be 5% in case of the material having the thickness of 1.0 mm.

TABLE 9

| No. | Si | Fe | Cu | Mn | Ni | Mg | Cr | Zr | Ti | Al |
|---|---|---|---|---|---|---|---|---|---|---|
| a | 0.68 | 0.27 | 1.40 | 1.2 | — | — | — | — | — | Remainder |
| b | 0.73 | 0.24 | 2.19 | 1.1 | — | — | — | — | — | Remainder |
| c | 1.71 | 0.30 | 1.43 | 1.2 | — | — | — | — | — | Remainder |
| d | 0.35 | 0.25 | 2.27 | 1.1 | — | — | — | — | — | Remainder |
| e | 0.68 | 1.05 | 1.41 | 1.1 | — | — | — | — | — | Remainder |
| f | 0.70 | 0.31 | 2.16 | 0.3 | — | — | — | — | — | Remainder |
| g | 0.67 | 0.24 | 1.39 | 1.1 | 0.6 | — | — | 0.14 | — | Remainder |
| h | 0.65 | 0.27 | 1.42 | 1.2 | — | — | 0.15 | — | 0.16 | Remainder |
| i | 0.74 | 0.29 | 1.35 | 1.3 | — | 0.11 | — | — | — | Remainder |
| j | 0.52 | 0.47 | 0.15 | 1.1 | — | — | — | — | 0.01 | Remainder |

TABLE 10

|  | No. | Solder alloy | Core alloy | Braze heating conditions |
|---|---|---|---|---|
| Example of present invention | 47 | A | a | 580° C. × 5 min. |
|  | 48 | A | c | 580° C. × 5 min. |
|  | 49 | A | f | 580° C. × 5 min. |
|  | 50 | B | b | 580° C. × 5 min. |
|  | 51 | C | a | 580° C. × 5 min. |
|  | 52 | D | b | 580° C. × 5 min. |
|  | 53 | E | b | 580° C. × 5 min. |
|  | 54 | F | b | 580° C. × 5 min. |
|  | 55 | F | d | 580° C. × 5 min. |
|  | 56 | F | g | 580° C. × 5 min. |
|  | 57 | F | i | 580° C. × 5 min. |
|  | 58 | G | a | 580° C. × 5 min. |
|  | 59 | H | b | 580° C. × 5 min. |
|  | 60 | H | e | 580° C. × 5 min. |
|  | 61 | H | h | 580° C. × 5 min. |
|  | 62 | I | b | 580° C. × 5 min. |
|  | 63 | J | b | 580° C. × 5 min. |
|  | 64 | K | a | 580° C. × 5 min. |
|  | 65 | L | b | 580° C. × 5 min. |
|  | 66 | M | a | 580° C. × 5 min. |
| Comparative example | 67 | N | b | 580° C. × 5 min. |
|  | 68 | O | b | 580° C. × 5 min. |
|  | 69 | P | b | 580° C. × 5 min. |
|  | 70 | Q | b | 580° C. × 5 min. |
|  | 71 | R | b | 580° C. × 5 min. |
|  | 72 | S | b | 580° C. × 5 min. |

TABLE 10-continued

| | No. | Brazing sheet Solder alloy | Core alloy | Braze heating conditions |
|---|---|---|---|---|
| Conventional example | 73 | T | b | 600° C. × 5 min. |
| | 74 | T | j | 600° C. × 5 min. |

A tensile test and an outside corrosion resistance test were made on the brazing sheet having the thickness of 1.0 mm after having been heated at the brazing temperature shown in Table 10.

CASS Test (JIS H 8681) was made for 100 hours as the outside corrosion resistance test, and the corrosive conditions resulting from this test were examined. A sample used was sealed except the center surface portion of the solder material in order not to be subject to the influence of a section of the sheet ends.

Further, the brazing sheet having the thickness of 0.25 mm was electro-united into a tube such that the solder material faces the outside. Then, this tube and a high-strength fin material were assembled into a three-stage core. In this case, the high-strength fin material has a thickness of 0.06 mm and consists of H14 material made of an Al-Si-Fe-Cu-Mn-Zn alloy with the contents of Si in an amount of 1.2% by weight, Fe in an amount of 0.25% by weight, Cu in an amount of 0.4% by weight, Mn in an amount of 1.1% by weight and Zn in an amount of 4% by weight.

The assembled core was coated with a solution containing a potassium fluoride flux at a concentration of 10%, and then heated for brazing under the presence of $N_2$ gas. The brazing temperature is shown in Table 4.

How the fin is crushed and the formation of a fillet were examined on the brazed core by means of external observation.

Further, as the outside corrosion resistance test, SWAAT (seawater acidified test, cyclic) test was made on the exactly-brazed core for 2000 hours on condition that the ends of the tube are masked. The degree of corrosion resulting from this test was examined, and the results thus obtained are shown in Table 11.

TABLE 11

| | | Characteristics after brazing | | | | | Recycling properties of scraps | |
|---|---|---|---|---|---|---|---|---|
| | No. | Tensile strength after braze heating (MPa) | Result of CASS | Occurrence of crushed fin | Conditions of fillet formed | Result of SWAAT | Utilization of brazing sheet scaraps when produced in factory in Table 1 | Utilization of scrapped heat exchanger in Table 1 |
| Example of present invention | 47 | 210 | No blister corrosion | None | Excellent | Non through pitting corrosion | Available | Available |
| | 48 | 255 | No blister corrosion | None | Excellent | Non through pitting corrosion | Available | Available |
| | 49 | 240 | No blister corrosion | None | Excellent | Non through pitting corrosion | Available | Available |
| | 50 | 245 | No blister corrosion | None | Excellent | Non through pitting corrosion | Available | Available |
| | 51 | 210 | No blister corrosion | None | Excellent | Non through pitting corrosion | Available | Available |
| | 52 | 245 | No blister corrosion | None | Excellent | Non through pitting corrosion | Available | Available |
| | 53 | 245 | No blister corrosion | None | Excellent | Non through pitting corrosion | Available | Available |
| | 54 | 245 | No blister corrosion | None | Excellent | Non through pitting corrosion | Available | Available |
| | 55 | 230 | No blister corrosion | None | Excellent | Non through pitting corrosion | Available | Available |
| | 56 | 235 | No blister corrosion | None | Excellent | Non through pitting corrosion | Available | Available |
| | 57 | 215 | No blister corrosion | None | Excellent | Non through pitting corrosion | Available | Available |
| | 58 | 210 | No blister corrosion | None | Excellent | Non through pitting corrosion | Available | Available |
| | 59 | 245 | No blister corrosion | None | Excellent | Non through pitting corrosion | Available | Available |
| | 60 | 215 | No blister corrosion | None | Excellent | Non through pitting corrosion | Available | Available |
| | 61 | 220 | No blister corrosion | None | Excellent | Non through pitting corrosion | Available | Available |
| | 62 | 245 | No blister corrosion | None | Excellent | Non through pitting corrosion | Available | Available |
| | 63 | 245 | No blister corrosion | None | Excellent | Non through pitting corrosion | Available | Available |
| | 64 | 210 | No blister corrosion | None | Excellent | Non through pitting corrosion | Available | Available |
| | 65 | 245 | No blister corrosion | None | Excellent | Non through pitting corrosion | Available | Available |
| | 66 | 210 | No blister corrosion | None | Excellent | Non through pitting corrosion | Available | Available |
| | 67 | 245 | No blister corrosion | None | Excellent | Non through pitting corrosion | Available | Available |
| Comparative example | 68 | 210 | No blister corrosion | None | Not formed | Through pitting corrosion | Available | Available |
| | 69 | 240 | Occurrence of blister corrosion | None | Not formed | Through pitting corrosion | Not available | Not available |
| | 70 | 210 | Occurrence of blister corrosion | None | Excellent | Through pitting corrosion | Not available | Not available |
| | 71 | 240 | No blister corrosion | None | Not formed | Through pitting corrosion | Available | Available |
| | 72 | 210 | Occurrence of blister corrosion | None | Excellent | Through pitting corrosion | Available | Available |
| Conventional example | 73 | 245 | Impossible to make test | Occurred | Tube is melted | Impossible to make test | Not available | Not available |
| | 74 | 125 | Occurrence of blister corrosion | Occurred | Excellent | Non through pitting corrosion | Not available | Not available |

As is apparent from Table 11, with respect to brazing sheets (Nos. 47 to 67) as the examples of the present invention, although the scrap material was mixed to the solder material of each brazing sheet, these brazing sheets are excellent in various characteristics such as the tensile strength after heating for brazing, the prevention of the fin from being crushed, the shape of fillets, and the results of CASS test and SWAAT test. Thus, it is proved that the resources are effectively reused through the recycling of the scraps for the solder material of the brazing sheet.

Further, since the brazing temperature is made lower, there was no possibility that the fin is crushed in brazing, although the high-strength fin material having the low melting point was used. In addition, the core alloy of the brazing sheet containing Cu in an amount of more than 1.2% by weight was brazed without being melted in brazing.

On the other hand, with respect to each of brazing sheets Nos. 69 and 70 as the comparative examples, since its solder material does not contain Mn nor Cu, these brazing sheets were not recycled (i.e., the scrap material and the solder material could not be mixed together). Besides, these brazing sheets are inferior in outside corrosion resistance. In particular, with respect to the brazing sheet No. 69, since its solder material does not contain Cu, the melting point of the solder was increased to degrade the brazing properties, and as a result, the satisfactory fillet was not formed.

With respect to brazing sheets Nos. 68, 71 and 72, although their solder material compositions are different from those of the present invention, it is possible to recycle the scrap material for the solder material. However, with respect to the brazing sheet No. 68, since the content of Si in the solder material is smaller than that in the range defined according to the present invention, the melting point of the solder material was increased to degrade the brazing properties, and as a result, the satisfactory fillet was not formed.

With respect to the brazing sheet No. 71, since the content of Mn in the solder material is larger than that in the range defined according to the present invention, the fluidity of the solder was degraded, and as a result, no fillet was formed. With respect to the brazing sheet No. 72, since the content of Zn in the solder material is smaller than that in the range defined according to the present invention, the outside corrosion resistance was degraded.

With respect to each of brazing sheets Nos. 73 and 74 respectively using the conventional solder material, since its solder material does not contain Mn, Cu and Zn, the scrap material could not be recycled for the solder material. Further, since the brazing temperature was as high as 600° C., the fin was crushed in either case. In particular, with respect to the brazing sheet No. 73, since the large amount of Cu is contained in the core material, the tube was melted, and as a result, the corrosion test could not be made.

As described in the foregoing, the heat exchanger manufactured using the brazing sheet consisting of the solder material of the present invention enables the reduction of buckling of the fin during the brazing, and is effective in improving the thermal conductivity and strength of members. In addition, the size and weight of the heat exchanger can be reduced. Further, since the solder material of the present invention contains Si, Fe, Cu, Mn and Zn as essential alloying elements, the scrapped Al alloy heat exchangers or the like using the brazing sheet can be used as the raw material to renewedly manufacture a solder material of the present invention, and therefore, the solder material of the present invention is excellent in scrap recycling properties.

What is claimed is:

1. An Al alloy solder composition comprising:
   >7.0 to 12.0 weight % Si;
   >0.4 to 8.0 weight % Cu;
   >0.5 to 6.0 weight % Zn;
   0.3 to 1.2 weight % Mn;
   >0.05 to 0.5 weight % Fe;
   0.0 to 0.3 weight % In;
   0.0 to 0.3 weight % Sn; and
   wherein the balance is Al and inevitable impurities.

2. A method of manufacturing the Al alloy solder composition of claim 1, comprising recovering the Al alloy solder composition from scrapped Al alloy heat exchangers or factory scraps of Al alloy brazing sheets.

3. A brazing sheet for a fin of a heat exchanger, comprising:
   a core sheet made of an Al-Si-Fe or Al-Si-Fe-Cu-Mn alloy and having a pair of opposing surfaces;
   a layer of an Al alloy solder clad on both of said opposing surfaces of said core sheet, said Al alloy solder having a composition comprising:
   >7.0 to 12.0 weight % Si;
   >0.4 to 8.0 weight % Cu;
   >0.5 to 6.0 weight % Zn;
   >0.05 to 1.2 weight % Mn;
   >0.05 to 0.5 weight % Fe;
   0.0 to 0.3 weight % In;
   0.0 to 0.3 weight % Sn; and
   wherein the balance is Al and inevitable impurities.

4. A brazing sheet for forming a fluid passage component of a heat exchanger, said brazing sheet comprising:
   a core sheet made of an Al-Si-Fe-Cu-Mn alloy and having a first surface constituting the exterior of a fluid passage of the heat exchanger and an opposing second surface;
   an Al alloy solder layer clad on said first surface and having a composition comprising:
   >7.0 to 12.0 weight % Si;
   >0.4 to 8.0 weight % Cu;
   >0.5 to 6.0 weight % Zn;
   >0.05 to 1.2 weight % Mn;
   >0.05 to 0.5 weight % Fe;
   0.0 to 0.3 weight % In;
   0.0 to 0.3 weight % Sn; and
   an Al sacrificial alloy clad on said second surface.

5. A brazing sheet for forming a fluid passage component of a heat exchanger, comprising:
   a core sheet material made of an Al-Si-Fe-Cu-Mn alloy and having one surface constituting the exterior of a fluid passage of the heat exchanger and an opposing second surface; and
   an Al alloy solder layer clad on said one surface and having a composition comprising:
   >7.0 to 12.0 weight % Si;
   >0.4 to 8.0 weight % Cu;
   >0.5 to 6.0 weight % Zn;
   >0.05 to 1.2 weight % Mn;
   >0.05 to 0.5 weight % Fe;
   0.0 to 0.3 weight % In;
   0.0 to 0.3 weight % Sn; and
   wherein the balance is Al and inevitable impurities.

6. A brazing sheet for forming a fluid passage component of a heat exchanger, comprising:
   a core sheet made of an Al-Si-Fe-Cu-Mn alloy and having a pair of opposing surfaces wherein both of said opposing surfaces of said core sheet are clad with an Al alloy solder having a composition comprising:
   >7.0 to 12.0 weight % Si;
   >0.4 to 8.0 weight % Cu;

>0.5 to 6.0 weight % Zn;
>0.05 to 1.2 weight % Mn;
>0.05 to 0.5 weight % Fe;
0.0 to 0.3 weight % In; and
0.0 to 0.3 weight % Sn.

7. A method of manufacturing an Al alloy heat exchanger, comprising the steps of:

forming the brazing sheet according to claim 3 into components of the heat exchanger; and subsequently assembling said components into the heat exchanger by means of brazing at temperatures in the range from 570° to 585° C.

* * * * *